(12) United States Patent
Nakamura

(10) Patent No.: US 11,121,700 B2
(45) Date of Patent: Sep. 14, 2021

(54) FILTER AND MULTIPLEXER

(71) Applicant: Murata Manufacturing Co., Ltd., Nagaokakyo (JP)

(72) Inventor: Shinichi Nakamura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 45 days.

(21) Appl. No.: 16/656,902

(22) Filed: Oct. 18, 2019

(65) Prior Publication Data

US 2020/0162057 A1 May 21, 2020

(30) Foreign Application Priority Data

Nov. 20, 2018 (JP) .............................. JP2018-217602
Aug. 27, 2019 (JP) .............................. JP2019-154599

(51) Int. Cl.
| | |
|---|---|
| *H03H 9/64* | (2006.01) |
| *H03H 9/145* | (2006.01) |
| *H03H 9/02* | (2006.01) |
| *H03H 7/01* | (2006.01) |
| *H03H 9/68* | (2006.01) |
| *H03H 9/72* | (2006.01) |

(52) U.S. Cl.
CPC ........ *H03H 9/6489* (2013.01); *H03H 7/0115* (2013.01); *H03H 9/02842* (2013.01); *H03H 9/02992* (2013.01); *H03H 9/14588* (2013.01); *H03H 9/6479* (2013.01); *H03H 9/68* (2013.01); *H03H 9/725* (2013.01)

(58) Field of Classification Search
CPC ........... H03H 9/145; H03H 9/25; H03H 9/64; H03H 9/6483; H03H 9/72; H03H 9/725
See application file for complete search history.

(56) References Cited

U.S. PATENT DOCUMENTS

| | | | | |
|---|---|---|---|---|
| 6,154,105 A | * | 11/2000 | Fujimoto | ............. H03H 9/6459 310/313 A |
| 6,900,577 B2 | * | 5/2005 | Takamine | ............ H03H 9/0028 310/313 D |
| 7,015,776 B2 | * | 3/2006 | Takamine | ............ H03H 9/0042 333/195 |
| 2018/0131348 A1 | * | 5/2018 | Takahashi | .......... H03H 9/02992 |

FOREIGN PATENT DOCUMENTS

| | | |
|---|---|---|
| JP | 09-116372 A | 5/1997 |
| JP | 2018-078489 A | 5/2018 |

* cited by examiner

*Primary Examiner* — Dean O Takaoka
(74) *Attorney, Agent, or Firm* — Keating & Bennett, LLP

(57) ABSTRACT

A transmission filter includes a transmission filter circuit and an additional circuit. The transmission filter circuit is provided between a first terminal and a second terminal. Between the first terminal and the second terminal, the additional circuit is connected in parallel with at least a portion of the transmission filter circuit. The additional circuit includes an IDT electrode group including a plurality of IDT electrodes located next to each other in an acoustic wave propagation direction and two reflectors that sandwich the IDT electrode group and having different numbers of pairs of electrode fingers.

14 Claims, 3 Drawing Sheets

FILTER AND MULTIPLEXER

CROSS REFERENCE TO RELATED APPLICATIONS

This application claims the benefit of priority to Japanese Patent Application No. 2018-217602 filed on Nov. 20, 2018 and Japanese Patent Application No. 2019-154599 filed on Aug. 27, 2019. The entire contents of each application are hereby incorporated herein by reference.

BACKGROUND OF THE INVENTION

1. Field of the Invention

The present invention relates to a filter and a multiplexer each including an additional circuit.

2. Description of the Related Art

In acoustic wave filters and multiplexers including acoustic wave filters, an improvement of attenuation characteristics of a filter and an improvement of isolation characteristics between filters are required. For these improvements, cancellation circuits have been used (see, for example, Japanese Unexamined Patent Application Publication No. 2018-78489). A cancellation circuit is an additional circuit that is connected in parallel with a filter circuit and generates a cancellation signal opposite in phase to out-of-band signal components transmitted through the filter circuit. Japanese Unexamined Patent Application Publication No. 2018-78489 discloses a cancellation circuit including a longitudinally coupled acoustic wave resonator and a capacitor.

With the wider frequency band of a filter as a backdrop, desired phase adjustment is difficult to perform in a target frequency band with a configuration in the related art. Sufficient attenuation characteristics and sufficient isolation characteristics are sometimes difficult to realize.

SUMMARY OF THE INVENTION

Preferred embodiments of the present invention significantly improve attenuation characteristics and isolation characteristics in filters and multiplexers each including an additional circuit.

A filter according to a preferred embodiment of the present invention includes a filter circuit provided between a first terminal and a second terminal and an additional circuit connected in parallel with at least a portion of the filter circuit. The additional circuit includes an interdigital transducer (IDT) electrode group including a plurality of IDT electrodes arranged in an acoustic wave propagation direction and two reflectors that sandwich the IDT electrode group and including different numbers of pairs of electrode fingers.

A multiplexer according to a preferred embodiment of the present invention includes a first filter and a second filter one ends of which are connected to each other. At least one of the first filter and the second filter is the above-described filter.

With filters according to preferred embodiments of the present invention in which the numbers of pairs of electrode fingers in the two reflectors in the IDT electrode group (for example, the longitudinally coupled resonator) in the additional circuit are different from each other, the phase adjustment range of the additional circuit can be broadened on the basis of the combination of different reflection characteristics corresponding to the different numbers of pairs of electrode fingers. As a result, the appropriate phase adjustment of the additional circuit and the effective attenuation of an out-of-band signal component can be easily performed. The filters each having excellent attenuation characteristics can therefore be provided. With the above filters having excellent attenuation characteristics, multiplexers having excellent isolation characteristics can be provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described in detail below with reference to the respective preferred embodiments and drawings. The preferred embodiments to be described below represent a comprehensive or concrete example. The numerical values, shapes, materials, components, the arrangement and connection configuration of the components to be described in the following preferred embodiments are merely illustrative, and are not intended to limit the scope of the present invention. In the following preferred embodiments, the expression of "connected" means not only that components are directly connected to each other by a wiring conductor but also that the components are electrically connected to each other via another circuit element.

PREFERRED EMBODIMENTS

As examples of filters according to preferred embodiments of the present invention and multiplexers according to preferred embodiments of the present invention, a transmission filter including an additional circuit and a duplexer including the transmission filter and a reception filter will be described.

First, the basic configurations and operations of a filter and a multiplexer each including an additional circuit according to a preferred embodiment will be described. Subsequently, the distinctive configurations and advantageous effects of a filter according to a preferred embodiment of the present invention and a multiplexer according to a preferred embodiment will be described.

Figure 1:
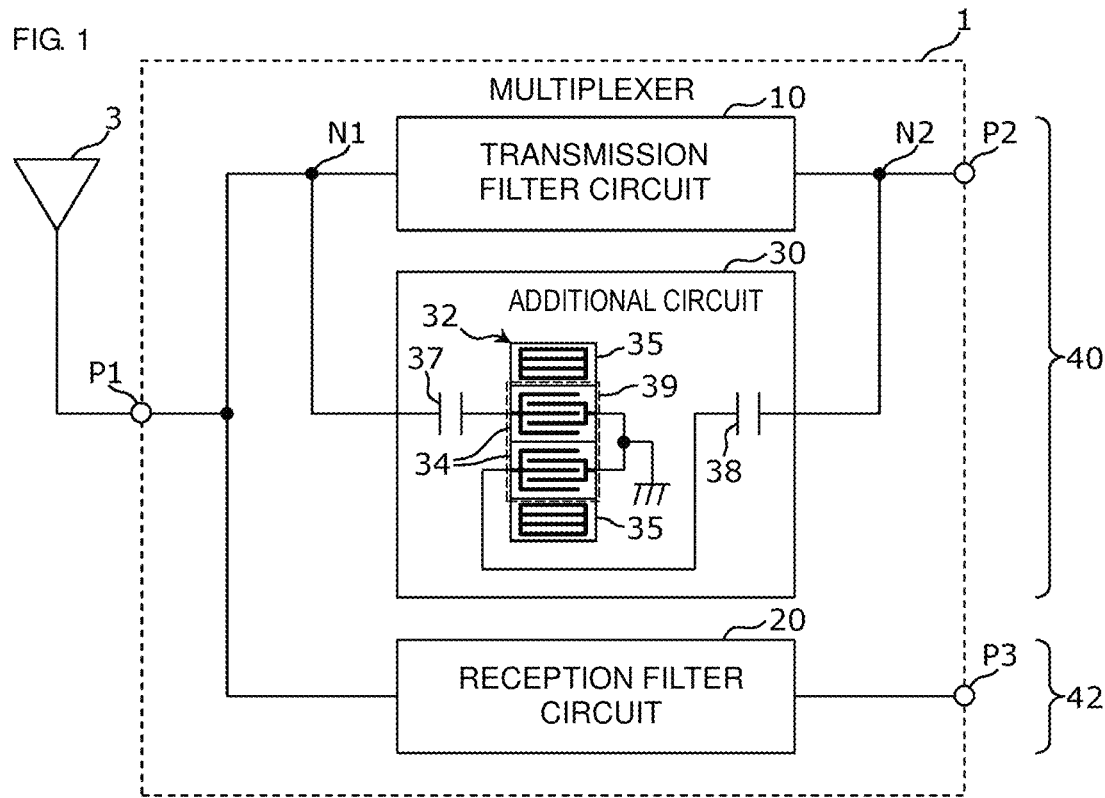
FIG. 1 is a block diagram showing a basic configuration of a multiplexer including an additional circuit according to a preferred embodiment of the present invention.

FIG. 1 is a block diagram showing a basic configuration of a multiplexer including an additional circuit according to a preferred embodiment of the present invention. As shown in FIG. 1, a multiplexer 1 includes terminals P1, P2, and P3, a transmission filter circuit 10, a reception filter circuit 20, and an additional circuit 30.

The terminals P1, P2, and P3 are examples of a first terminal, a second terminal, and a third terminal, respectively.

The terminal P1 is connected to an antenna 3.

The transmission filter circuit 10 is provided between the terminals P1 and P2. One end and the other end of the transmission filter circuit 10 may be directly connected to the terminals P1 and P2, respectively or may be connected to them via other circuit elements (not shown). Although not particularly limited, the transmission filter circuit 10 may preferably be, for example, an acoustic wave filter including an acoustic wave resonator or an LC resonator filter including an inductor and a capacitor.

The reception filter circuit 20 is provided between the terminals P1 and P3. On end and the other end of the reception filter circuit 20 may be directly connected to the terminals P1 and P3, respectively or may be connected to them via other circuit elements (not shown). Although not particularly limited, the reception filter circuit 20 may preferably be, for example, an acoustic wave filter including an acoustic wave resonator or an LC resonator filter including an inductor and a capacitor.

Between the terminals P1 and P2, the additional circuit is connected in parallel with at least a portion of the transmission filter circuit 10. Between the terminals P1 and P2, one end and the other end of the additional circuit 30 are connected to nodes N1 and N2, respectively, on a signal path including the transmission filter circuit 10. The nodes N1 and N2 may be in the transmission filter circuit 10.

The additional circuit 30 includes a longitudinally coupled resonator 32 and capacitive elements 37 and 38 which are connected in series with each other. An IDT electrode group 39 includes two IDT electrodes 34 located next to each other in an acoustic wave propagation direction (for example, the top-bottom direction in FIG. 1). One of the two IDT electrodes 34 includes one end connected to the node N1 via the capacitive element 37 and the other end connected to a ground electrode. The other one of the two IDT electrodes 34 includes one end connected to the node N2 via the capacitive element 38 and the other end connected to the ground electrode. The number of the IDT electrodes 34 is not limited to two, and may be three or more (not shown).

The IDT electrode group 39 and reflectors 35 located on either side of the IDT electrode group 39 in the acoustic wave propagation direction define the longitudinally coupled resonator 32 that transmits a signal using the coupling of acoustic waves. The IDT electrode group 39 may define not only a longitudinally coupled resonator but also a transversal filter. The transversal filter may include an acoustic material (not shown) instead of the reflectors 35.

The capacitive element 37 is connected between the longitudinally coupled resonator 32 and the node N1. The capacitive element 38 is connected between the longitudinally coupled resonator 32 and the node N2.

The IDT electrode group 39 controls the phase of a signal passing through the additional circuit 30. The capacitive elements 37 and 38 control the amplitude of a signal passing through the additional circuit 30. The additional circuit 30 generates a cancellation signal for an out-of-band signal component in a target frequency band (that is, a cancellation target signal component) transmitted by the transmission filter circuit 10.

The amplitude of a result of the combination of the cancellation signal and the cancellation target signal component is smaller than that of the cancellation target signal component. The cancellation signal is in opposite phase to the cancellation target signal component, and is preferably of the same or substantially the same amplitude as the cancellation target signal component, for example.

The fact that the cancellation target signal component and the cancellation signal are in opposite phase to each other means that the absolute value of the phase difference between them is greater than 90° in the range of −180° to 180°. This also means that the cancellation target signal component and the cancellation signal have opposite phase components.

The cancellation signal is preferably of the same or substantially the same amplitude as the cancellation target signal component, but may be of the different amplitude, for example. When the amplitude of a result of the combination of the cancellation signal and the cancellation target signal component is smaller than that of the cancellation target signal component on the basis of the phase difference between them, attenuation characteristics can be significantly improved.

The transmission filter circuit 10 and the additional circuit 30 define a transmission filter 40. The reception filter circuit 20 defines a reception filter 42. The transmission filter 40 and the reception filter 42 define a duplexer that demultiplexes and multiplexes a transmission signal and a reception signal.

Next, the basic configuration of a longitudinally coupled resonator according to a preferred embodiment will be described. The longitudinally coupled resonator 32 included in the additional circuit 30 includes the two IDT electrodes 34 and the two reflectors 35. The two IDT electrodes 34 are arranged in the acoustic wave propagation direction. The reflectors 35 sandwich the IDT electrodes 34 in the acoustic wave propagation direction. The longitudinally coupled resonator 32 may include three or more IDT electrodes (not shown).

Figure 2:
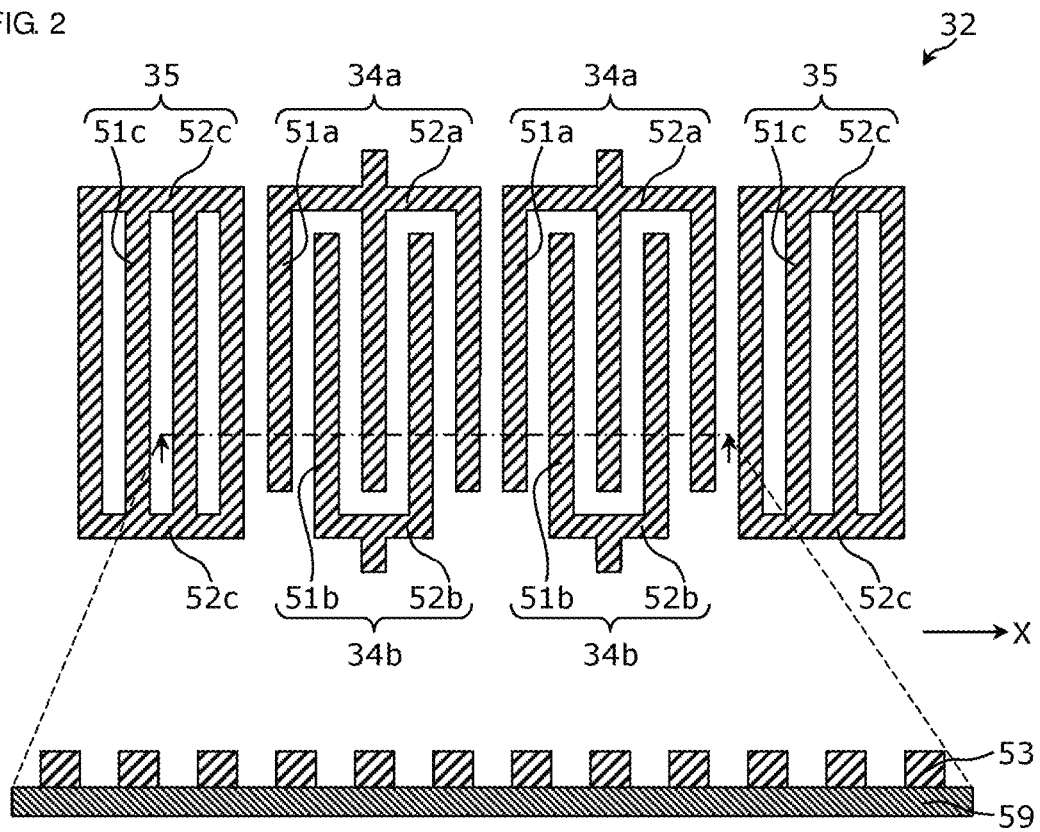
FIG. 2 is a plan view and a cross-sectional view of a longitudinally coupled resonator which show a basic configuration of the longitudinally coupled resonator.

FIG. 2 is a plan view and a cross-sectional view of the longitudinally coupled resonator 32 which shows a basic configuration of the longitudinally coupled resonator 32. The example in FIG. 2 is used to describe the basic configuration of the longitudinally coupled resonator 32. The number of electrode fingers defining an electrode, the length of the electrode finger, and the like are not limited to those shown in FIG. 2.

The IDT electrode 34 includes a pair of comb-shaped electrodes 34a and 34b facing each other. The comb-shaped electrode 34a includes a plurality of electrode fingers 51a that are parallel or substantially parallel to each other and a busbar electrode 52a connecting one ends of the electrode fingers 51a. The comb-shaped electrode 34b includes a plurality of electrode fingers 51b that are parallel or substantially parallel to each other and a busbar electrode 52b connecting one ends of the electrode fingers 51b.

The electrode fingers 51a and the electrode finger 51b extend in a direction orthogonal or substantially orthogonal to an acoustic wave propagation direction X to interdigitate with each other. The single electrode finger 51a and the single electrode finger 51b which are adjacent to each other define a single pair. The number of pairs of electrode fingers in the IDT electrode 34 is represented by an average value of the numbers of the electrode fingers 51a and the electrode fingers 51b.

Both of the numbers of pairs of electrode fingers in the two IDT electrodes 34 in the example of the longitudinally coupled resonator 32 shown in FIG. 2 are preferably 2.5, for example, but may be differ from each other. Not only the number of pairs of electrode fingers but also various electrode parameters, for example, an electrode finger intersecting width, a pitch, and a duty ratio may differ from the IDT electrode 34 to the IDT electrode 34.

The reflector 35 includes a plurality of electrode fingers 51c that are parallel or substantially parallel to each other and a busbar electrode 52c connecting one ends of the electrode fingers 51c to each other and the other ends of the electrode fingers 51c to each other. The electrode fingers 51c extend in a direction orthogonal or substantially orthogonal to the acoustic wave propagation direction X.

As in the case of the number of pairs of electrode fingers in the IDT electrode 34, a pair of the two electrode fingers 51c in the reflector 35 which are adjacent to each other in the acoustic wave propagation direction define a pair. In the example of the longitudinally coupled resonator 32 shown in FIG. 2, both of the numbers of pairs of electrode fingers in the two reflectors 35 are preferably two, for example, and are equal to each other.

The electrode fingers 51a, 51b, and 51c and the busbar electrodes 52a, 52b, and 52c are defined by an electrode layer 53 on a piezoelectric layer 59.

The electrode layer 53 may preferably include, for example, a metal such as copper or aluminum or the alloy thereof. The piezoelectric layer 59 may preferably include, for example, a piezoelectric material including lithium tantalite or lithium niobate. The electrode layer 53 may be provided on the piezoelectric layer 59 via an adhesion layer (not shown). The piezoelectric layer 59 may be provided on a support substrate including silicon. The piezoelectric layer 59 itself may be a support substrate. The piezoelectric layer 59 may have a layered structure in which two types of piezoelectric layers with different acoustic wave propagation speeds are laminated.

In the transmission filter 40, a signal to be supplied to the transmission filter circuit 10 branches off and is also supplied to the additional circuit 30. The signal supplied to the additional circuit 30 is subjected to phase rotation in the longitudinally coupled resonator 32 and amplitude adjustment in the capacitive elements 37 and 38 and is output as a cancellation signal that is in opposite phase to a cancellation target signal passing through the transmission filter circuit 10 and is preferably of the same or substantially the same amplitude as the cancellation target signal, for example.

When the amplitude of a result of the combination of the cancellation target signal and the cancellation signal is smaller than that in the cancellation target signal, the attenuation characteristics and isolation characteristics of the whole of the transmission filter 40 are significantly improved. That is, the attenuation of an out-of-band signal component in the transmission filter 40 can be larger than that of only the transmission filter circuit 10. Furthermore, in the multiplexer 1, in addition to the attenuation, excellent isolation characteristics can also be realized.

However, as described above, with the wider frequency band of a filter as a backdrop, desired phase adjustment is difficult to perform in a target frequency band with the configuration of the multiplexer 1. Sufficient attenuation characteristics and sufficient isolation characteristics are sometimes difficult to achieve.

In the present preferred embodiment, a longitudinally coupled resonator in which two reflectors having different numbers of pairs of electrode fingers sandwich IDT electrodes defines an additional circuit.

Figure 3:
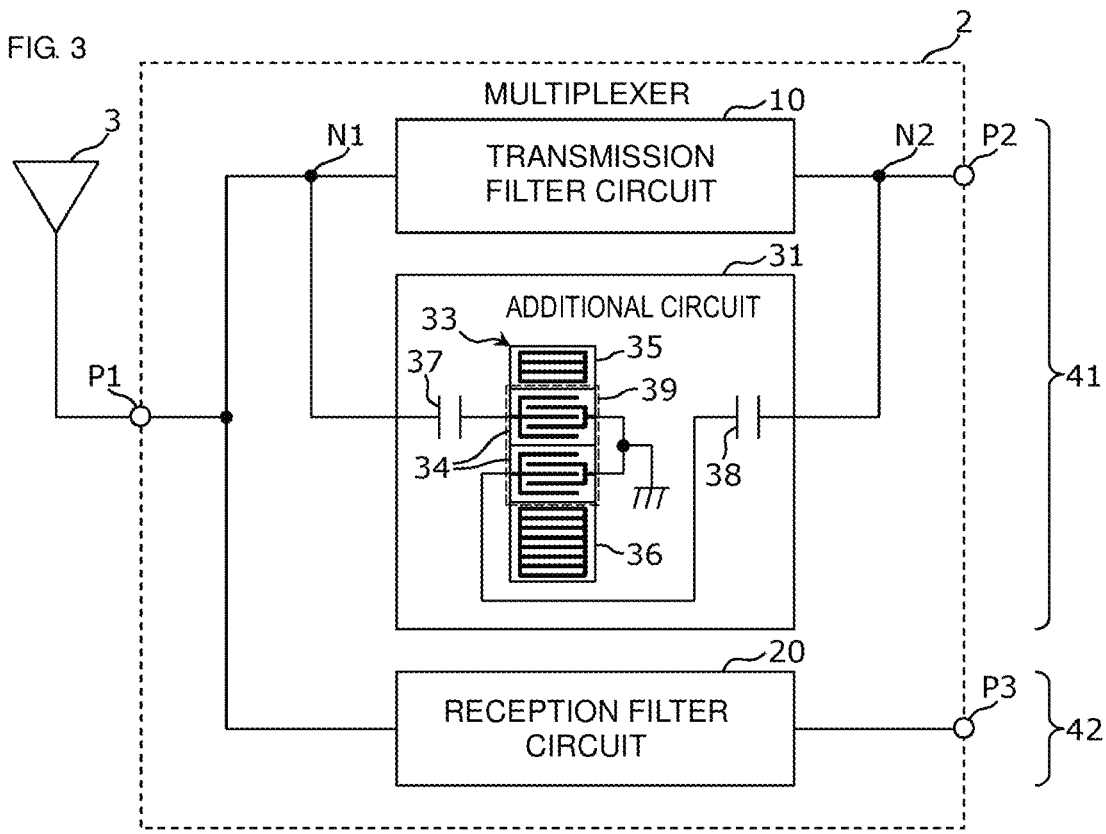
FIG. 3 is a block diagram showing a configuration of a multiplexer according to a preferred embodiment of the present invention.

FIG. 3 is a block diagram showing a configuration of a multiplexer according to a preferred embodiment of the present invention. A multiplexer 2 shown in FIG. 3 differs from the multiplexer 1 shown in FIG. 1 in that the reflector 35 and a reflector 36 in a longitudinally coupled resonator 33 in an additional circuit 31 have different numbers of pairs of electrode fingers. Referring to FIG. 3, for example, the number of pairs of electrode fingers in the reflector 35 is preferably half (the ratio of 0.5) of that in the reflector 36.

The transmission filter circuit 10 and the additional circuit 31 define a transmission filter 41.

With this configuration in which the numbers of pairs of electrode fingers in the two reflectors 35 and 36 in the longitudinally coupled resonator 33 in the additional circuit 31 are different from each other, the phase adjustment range of the additional circuit 31 can be broadened on the basis of the combination of different reflection characteristics corresponding to the different numbers of pairs of electrode fingers.

As a result, the appropriate phase adjustment of the additional circuit 31 and the effective attenuation of an out-of-band signal component can be easily performed. The transmission filter 41 having excellent attenuation characteristics can therefore be provided. By using the transmission filter 41 having excellent attenuation characteristics, the multiplexer 2 having excellent isolation between transmission and reception sides can be provided.

A simulation result representing the advantageous effects of the transmission filter 41 including the additional circuit 31 and the multiplexer 2 will be described below on the basis of the comparison with the transmission filter 40 including the additional circuit 30 and the multiplexer 1.

In the simulation, the number of pairs of electrode fingers in the reflector 35 in the longitudinally coupled resonator 33 in the additional circuit 31 was set to the half (the ratio of 0.5) of that in the reflector 36 and the numbers of pairs of electrode fingers in the two reflectors 35 in the longitudinally coupled resonator 32 in the additional circuit 30 were set to the same value (the ratio of 1.0).

The transmission filters 40 and 41 was set to have the pass band (transmission band) of approximately 703 MHz to approximately 733 MHz. The reception filter 42 was set to have the pass band (reception band) of approximately 758 MHz to approximately 788 MHz. The frequency band of a cancellation target signal component in the transmission filters 40 and 41 is the same or substantially the same as the reception band of approximately 758 MHz to approximately 788 MHz.

Figure 4:
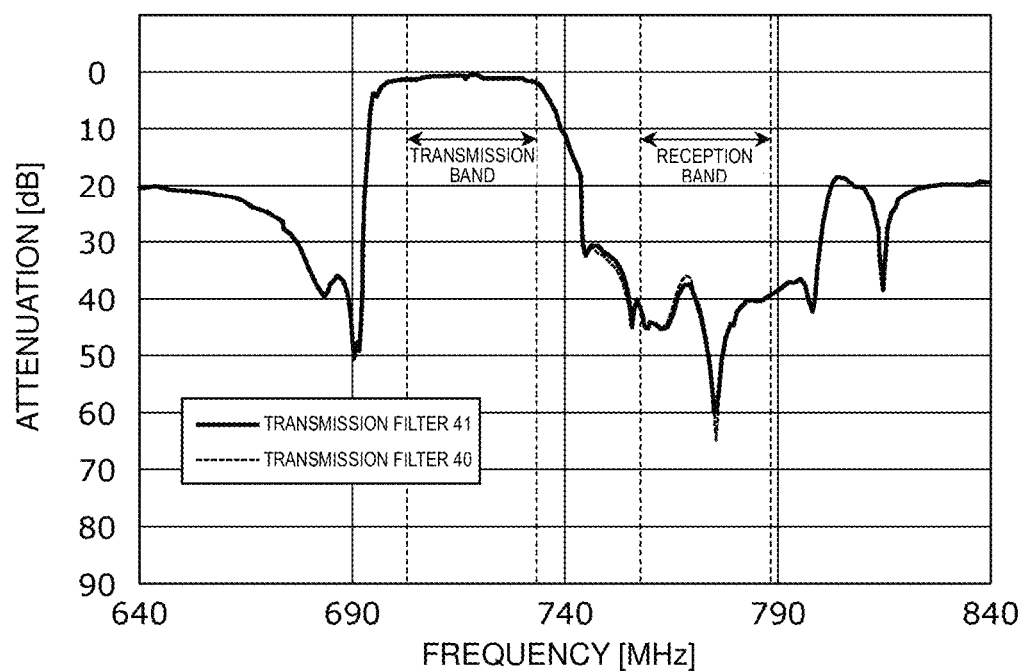
FIG. 4 is a graph showing bandpass characteristics of a transmission filter according to a preferred embodiment of the present invention.

FIG. 4 is a graph showing bandpass characteristics between the terminals P1 and P2 in the transmission filters 40 and 41.

As shown in FIG. 4, the minimum value of the attenuation in the reception band is approximately 38 dB in the transmission filter 41 and approximately 36 dB in the transmission filter 40. That is, the transmission filter 41 has improved attenuation characteristics in the cancellation band as compared to the transmission filter 40.

Figure 5:
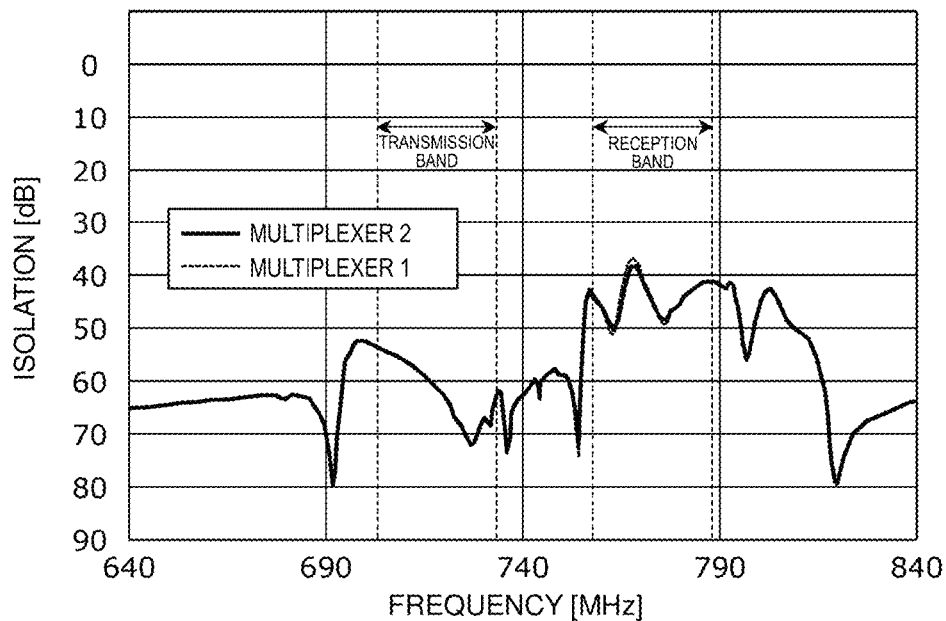
FIG. 5 is a graph showing isolation characteristics of a multiplexer according to a preferred embodiment of the present invention.

FIG. 5 is a graph showing isolation characteristics between the terminals P3 and P2 in the multiplexers 1 and 2.

As shown in FIG. 5, the minimum value of the isolation between transmission and reception sides in the reception band is approximately 38 dB in the multiplexer 2 and approximately 37 dB in the multiplexer 1. That is, the multiplexer 2 has improved isolation characteristics in the cancellation band as compared to the multiplexer 1.

Thus, it was discovered that, by making the numbers of pairs of electrode fingers in the two reflectors in the longitudinally coupled resonator in the additional circuit different from each other, the attenuation of the filter and the isolation of the multiplexer in the reception band could be significantly improved as compared with the case where the numbers of pairs of electrode fingers were the same.

In the simulation, the effective range of the ratio of the number of pairs of electrode fingers in a reflector that significantly improves the attenuation of a filter and the isolation of a multiplexer was further examined.

Figure 6:
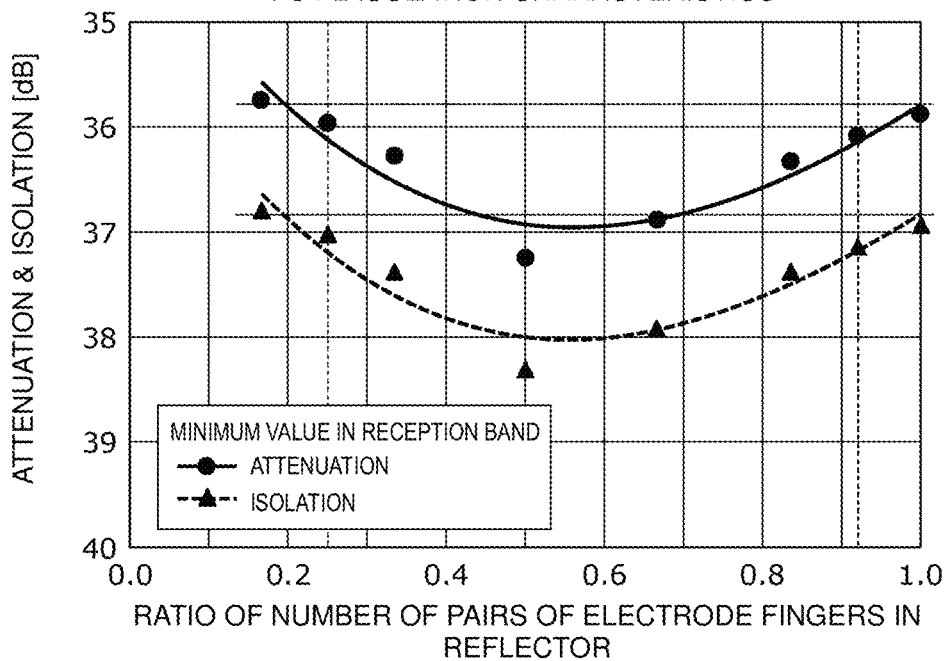
FIG. 6 is a graph showing a relationship between each of bandpass characteristics and isolation characteristics and the ratio of the number of pairs of electrode fingers in a reflector in a preferred embodiment of the present invention.

FIG. 6 is a graph showing a relationship between each of bandpass characteristics between the terminals P1 and P2 and isolation characteristics between the terminals P3 and P2 and the ratio of the number of pairs of electrode fingers in a reflector. In FIG. 6, the minimum values of the attenuation of a filter including an additional circuit including a longitudinally coupled resonator and the minimum values of the isolation of a multiplexer in the reception band when the ratio of the number of pairs of electrode fingers in a reflector in the longitudinally coupled resonator is changed are plotted. Approximation curves obtained with the plotted minimum values of the attenuation and the isolation in the reception band are also shown.

As shown in FIG. 6, in a case where the ratio of the number of pairs of electrode fingers in a reflector is in the range of about 0.25 to about 0.92, both of the attenuation and the isolation had larger (improved) values as compared with a case where the numbers of pairs of electrode fingers in reflectors are the same. As is apparent from FIG. 6, setting of the number of pairs of electrode fingers in a reflector in, for example, the range of about 0.25 to about 0.92 is effective to significantly improve the attenuation characteristics and the isolation characteristics.

Although filters according to preferred embodiments of the present invention and multiplexers according to preferred embodiments of the present invention have been described, the present invention is not limited to the above preferred embodiment. Various modifications to the preferred embodiments that can be conceived of by those skilled in the art, and configurations achieved by combining elements in different preferred embodiments without departing from the teachings of the present invention may be included in the scope of one or more aspects of the present invention.

In the above preferred embodiments, the application of the present invention to a transmission filter in a duplexer has been described. However, the present invention can be similarly applied to a reception filter in a duplexer or a single filter. The present invention may be applied to a filter in a diplexer, a triplexer, or a quadplexer that demultiplexes and multiplexes a plurality of signals in different frequency bands.

CONCLUSION

Filters according to preferred embodiments of the present invention each include a filter circuit provided between a first terminal and a second terminal and an additional circuit connected in parallel with at least a portion of the filter circuit. The additional circuit includes an interdigital transducer (IDT) electrode group including a plurality of IDT electrodes arranged in an acoustic wave propagation direction and two reflectors that sandwich the IDT electrode group and having different numbers of pairs of electrode fingers.

With this configuration in which the numbers of pairs of electrode fingers in the two reflectors in the additional circuit are different from each other, the phase adjustment range of the additional circuit can be broadened on the basis of the combination of different reflection characteristics corresponding to the different numbers of pairs of electrode fingers. As a result, the appropriate phase adjustment of the additional circuit can be easily performed, and a cancellation signal with which an out-of-band signal component is effectively attenuated can be easily obtained. The filter having excellent attenuation characteristics can therefore be provided.

The IDT electrode group and the two reflectors may define a longitudinally coupled resonator.

With this configuration, there can be provided a longitudinally coupled resonator having a broader phase adjustment range than a longitudinally coupled resonator that is included in an additional circuit and includes two reflectors having the same number of pairs of electrode fingers. With this longitudinally coupled resonator, there can be provided a filter having excellent out-of-band attenuation characteristics with more certainty.

The inequality of about $0.25 \leq M/N \leq$ about 0.92 is satisfied where M represents the smaller of the numbers of pairs of electrode fingers in the two reflectors and N represents the larger of the numbers of pairs of electrode fingers in the two reflectors.

With this configuration, a filter with improved out-of-band attenuation characteristics than a filter in which two reflectors in an additional circuit have the same number of pairs of electrode fingers can be provided.

A multiplexer according to a preferred embodiment of the present invention includes a first filter and a second filter, one ends of which are connected to each other. At least one of the first filter and the second filter is the above filter.

With this configuration in which the above filter having excellent attenuation characteristics is used, a multiplexer having excellent isolation characteristics can be provided.

INDUSTRIAL APPLICABILITY

Preferred embodiments of the present invention can be widely applied to communication devices, for example, cellular phones as a filter including an additional circuit and a multiplexer.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter comprising:
   a filter circuit provided between a first terminal and a second terminal; and
   an additional circuit connected in parallel with at least a portion of the filter circuit; wherein
   the additional circuit includes an interdigital transducer (IDT) electrode group including a plurality of IDT electrodes arranged in an acoustic wave propagation direction and two reflectors that sandwich the IDT electrode group;

the two reflectors include different numbers of pairs of electrode fingers; and one end of each of the plurality of IDT electrodes is connected to ground.

2. The filter according to claim 1, wherein the IDT electrode group and the two reflectors define a longitudinally coupled resonator.

3. The filter according to claim 1, wherein about $0.25 \leq M/N \leq$ about $0.92$ is satisfied where M represents a smaller number of the numbers of pairs of electrode fingers in the two reflectors and N represents a larger number of the numbers of pairs of electrode fingers in the two reflectors.

4. A multiplexer comprising:
a first filter and a second filter electrically connected to each other; wherein
at least one of the first filter and the second filter is the filter according to claim 1.

5. The multiplexer according to claim 4, wherein the first filter includes a transmission filter circuit and the second filter includes a reception filter circuit.

6. The multiplexer according to claim 5, wherein the additional circuit is connected in parallel with at least a portion of the transmission filter circuit.

7. The filter according to claim 1, wherein the filter circuit is an acoustic wave filter including an acoustic wave resonator or an LC resonator filter including an inductor and a capacitor.

8. The filter according to claim 1, wherein
the additional circuit includes a longitudinally coupled resonator, a first capacitive element, and a second capacitive element; and
the first capacitive element and the second capacitive element are connected in series with each other.

9. The filter according to claim 8, wherein
the plurality of IDT electrodes include a first IDT electrode and a second IDT electrode;
the first IDT electrode includes a first end electrically connected, via the first capacitive element, to an input of the filter circuit, and a second end electrically connected to a ground electrode; and
the second IDT electrode includes a first end electrically connected, via the second capacitive element, to an output of the filter circuit, and a second end electrically connected to the ground electrode.

10. The filter according to claim 1, wherein
each of the plurality of IDT electrodes is a comb-shaped electrode including:
a plurality of electrode fingers that are parallel or substantially parallel to each other; and
a busbar electrode connected to one end of each of the plurality of electrode fingers.

11. The filter according to claim 10, wherein the plurality of electrode fingers extend in a direction orthogonal or substantially orthogonal to the acoustic wave propagation direction.

12. The filter according to claim 1, wherein the additional circuit applies a phase rotation and an amplitude adjustment to a signal input to the additional circuit.

13. The filter according to claim 12, wherein
a signal output by the additional circuit is in opposite phase to a target signal passing through the filter circuit; and
the signal output by the additional circuit has the same or substantially the same amplitude as the target signal.

14. The filter according to claim 1, wherein a number of pairs of electrode fingers in a first reflector of the two reflectors is half of a number of pairs of electrode fingers in a second reflector of the two reflectors.

* * * * *